US008322300B2

(12) United States Patent
Pavani et al.

(10) Patent No.: US 8,322,300 B2
(45) Date of Patent: *Dec. 4, 2012

(54) EDGE COATING APPARATUS WITH MOVABLE ROLLER APPLICATOR FOR SOLAR CELL SUBSTRATES

(75) Inventors: Luca Pavani, Gilroy, CA (US); Emmanuel Abas, Sta. Rosa (PH)

(73) Assignee: SunPower Corporation, San Jose, CA (US)

( * ) Notice: Subject to any disclaimer, the term of this patent is extended or adjusted under 35 U.S.C. 154(b) by 915 days.

This patent is subject to a terminal disclaimer.

(21) Appl. No.: 12/069,043

(22) Filed: Feb. 7, 2008

(65) Prior Publication Data
US 2009/0202745 A1 Aug. 13, 2009

(51) Int. Cl.
*B05B 13/02* (2006.01)
*B05C 5/00* (2006.01)
*B05D 5/00* (2006.01)
*B05D 5/12* (2006.01)

(52) U.S. Cl. ....... 118/321; 118/308; 118/244; 427/96.9; 427/284

(58) Field of Classification Search ............... 118/7, 8, 118/50, 308, 318, 321, 319; 427/72, 278, 427/284, 96.9
See application file for complete search history.

(56) References Cited

U.S. PATENT DOCUMENTS

| 1,531,365 | A | * | 3/1925 | Wigley | 118/232 |
| 1,916,748 | A | * | 7/1933 | Wright | 156/107 |
| 2,313,750 | A | * | 3/1943 | Hothersall | 413/20 |
| 2,880,697 | A | * | 4/1959 | Blanding et al. | 118/320 |
| 3,324,625 | A | * | 6/1967 | Dulmage | 53/442 |
| 3,492,146 | A | * | 1/1970 | Kornaker | 427/72 |
| 3,575,131 | A | * | 4/1971 | Lohmann | 118/699 |
| 3,966,334 | A | * | 6/1976 | Forsberg | 401/9 |
| 4,007,704 | A | * | 2/1977 | Haviland | 118/701 |

(Continued)

FOREIGN PATENT DOCUMENTS

WO WO2007101135 A2 9/2007

(Continued)

OTHER PUBLICATIONS

J. Wohlgemuth, et al. "Large-Scale PV Module Manufacturing Using Ultra-Thin Polycrystalline Silicon Solar Cells", Oct. 1, 2003-Sep. 30, 2004 Annual Subcontract Report, 53 pages, Mar. 2005—NREL/SR-520-37738, National Renewable Energy Laboratory, Golden, Colorado.

(Continued)

*Primary Examiner* — Dah-Wei Yuan
*Assistant Examiner* — Karl Kurple
(74) *Attorney, Agent, or Firm* — Okamoto & Benedicto LLP

(57) ABSTRACT

A non-contact edge coating apparatus includes an applicator for applying a coating material on an edge of a solar cell substrate and a control system configured to drive the applicator. The control system may drive the applicator along an axis to maintain a distance with an edge of the substrate as the substrate is rotated to have the edge coated with a coating material. The applicator may include a recessed portion into which the edge of the substrate is received for edge coating. For example, the applicator may be a roller with a groove. Coating material may be introduced into the groove for application onto the edge of the substrate. A variety of coating materials may be employed with the apparatus including hot melt ink and UV curable plating resist.

14 Claims, 19 Drawing Sheets

U.S. PATENT DOCUMENTS

| | | | |
|---|---|---|---|
| 4,056,075 A * | 11/1977 | Seiderman | 118/696 |
| 4,069,354 A * | 1/1978 | Pekosh | 427/64 |
| 4,135,290 A * | 1/1979 | Evans, Jr. | 438/64 |
| 4,194,463 A * | 3/1980 | Kimbrough et al. | 118/409 |
| 4,535,721 A | 8/1985 | Yakura | |
| 4,936,203 A * | 6/1990 | Aoki et al. | 99/450.1 |
| 4,957,605 A | 9/1990 | Hurwitt et al. | |
| 4,968,375 A * | 11/1990 | Sato et al. | 156/345.23 |
| 4,989,059 A | 1/1991 | Micheels et al. | |
| 5,047,262 A * | 9/1991 | deVries et al. | 427/508 |
| 5,094,885 A | 3/1992 | Selbrede | |
| 5,298,072 A * | 3/1994 | Schiele et al. | 118/681 |
| 5,383,971 A | 1/1995 | Selbrede | |
| 5,411,897 A * | 5/1995 | Harvey et al. | 438/16 |
| 5,650,363 A | 7/1997 | Endroes et al. | |
| 5,749,970 A * | 5/1998 | Fukuta et al. | 118/320 |
| 5,840,129 A * | 11/1998 | Saenz et al. | 134/2 |
| 5,868,843 A | 2/1999 | Yang et al. | |
| 5,976,249 A * | 11/1999 | Stahl | 118/50 |
| 6,059,889 A * | 5/2000 | Jensen et al. | 134/6 |
| 6,231,327 B1 * | 5/2001 | Shanahan et al. | 425/113 |
| 6,265,328 B1 * | 7/2001 | Henley et al. | 438/782 |
| 6,448,155 B1 | 9/2002 | Iwasaki et al. | |
| 6,580,087 B1 * | 6/2003 | Suzuki et al. | 250/559.4 |
| 7,179,333 B2 * | 2/2007 | Woolley et al. | 118/318 |
| 7,208,046 B1 | 4/2007 | Anderson et al. | 118/320 |
| 2001/0013684 A1 * | 8/2001 | Smedt et al. | 279/106 |
| 2005/0000414 A1 * | 1/2005 | Culik et al. | 118/200 |
| 2007/0280805 A1 | 12/2007 | Sasamoto et al. | |
| 2008/0017316 A1 * | 1/2008 | Bailey et al. | 156/345.29 |
| 2009/0202727 A1 * | 8/2009 | Abas et al. | 427/284 |
| 2010/0326354 A1 * | 12/2010 | Sahoda et al. | 118/712 |

FOREIGN PATENT DOCUMENTS

WO  WO 2010011200 A1 *  1/2010

OTHER PUBLICATIONS

PCT International Search Report for Application No. PCT/US09/32278, Mar. 25, 2009, 2 sheets.

* cited by examiner

EDGE COATING APPARATUS WITH MOVABLE ROLLER APPLICATOR FOR SOLAR CELL SUBSTRATES

STATEMENT REGARDING FEDERALLY SPONSORED RESEARCH OR DEVELOPMENT

The invention described herein was made with Governmental support under contract number DE-FC36-07GO17043 awarded by the United States Department of Energy. The Government may have certain rights in the invention.

BACKGROUND OF THE INVENTION

1. Field of the Invention

The present invention relates generally to solar cells, and more particularly but not exclusively to solar cell fabrication tools and processes.

2. Description of the Background Art

Solar cells are well known devices for converting solar radiation to electrical energy. They may be fabricated on a solar cell substrate, such as a semiconductor wafer, using semiconductor processing technology. A solar cell includes P-type and N-type diffusion regions that form a junction. Solar radiation impinging on the solar cell creates electrons and holes that migrate to the diffusion regions, thereby creating voltage differentials between the diffusion regions. In a backside contact solar cell, both the diffusion regions and the metal contacts coupled to them are on the backside of the solar cell. The metal contacts allow an external electrical circuit to be coupled to and be powered by the solar cell.

An edge of a solar cell substrate may be coated with a dielectric for electrical isolation and to prevent metal deposition or growth on the substrate perimeter. The conventional approach for applying the coating material is to contact the edge of the substrate with a roller. The roller has a groove with a surface that is pushed against the edge of the substrate. Coating material supplied to the groove gets applied to the edge of the substrate when the roller and the substrate are rotated. The coating material may comprise thermal ink that needs to be cured in a large drying oven in a separate process step. The use of thermal ink thus necessitates relatively large capital investment due to the cost and large footprint of associated ovens. In addition when using a thermal oven, the materials deposited on the wafer surface in previous processing steps could be affected by exposure to oven temperature. Other problems associated with previous approaches to edge coating include stress applied to the substrate by direct mechanical contact with the applicator and poor reliability of the edge coat in processes using thermal ink.

SUMMARY

A non-contact edge coating apparatus includes an applicator for applying a coating material on an edge of a solar cell substrate and a control system configured to drive the applicator. The control system may drive the applicator along an axis to maintain a distance with an edge of the substrate as the substrate is rotated to have its edge coated with a coating material. The applicator may include a recessed portion into which the edge of the substrate is received for edge coating. For example, the applicator may be a roller with a groove. Coating material may be introduced into the groove for application onto the edge of the substrate. A variety of coating materials may be employed with the apparatus including hot melt ink and UV curable plating resist.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided, such as examples of apparatus, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
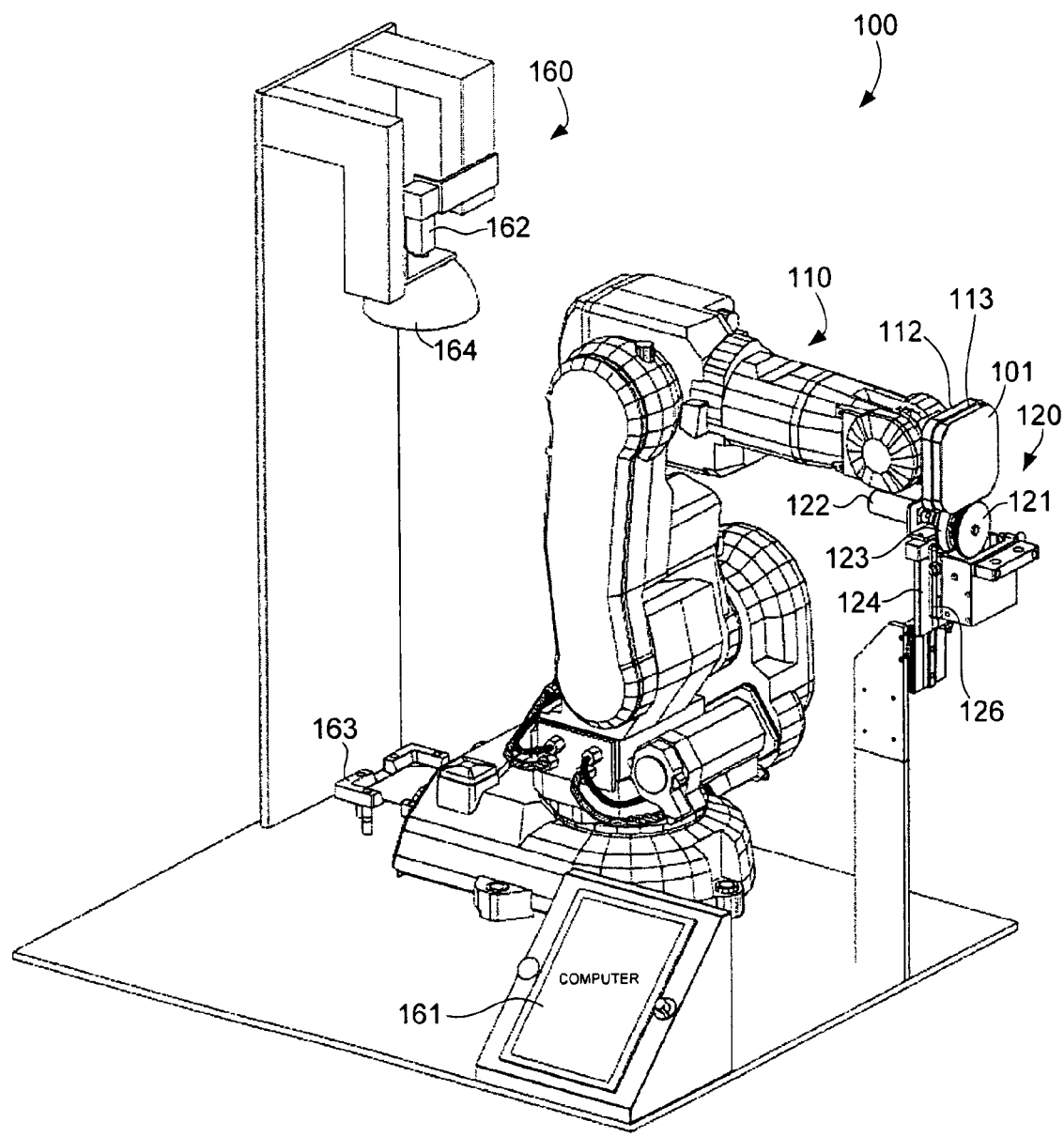
FIG. 1 shows a perspective view of a non-contact edge coating system for solar cells in accordance with an embodiment of the present invention.

FIG. 1 shows a perspective view of a non-contact edge coating system 100 for solar cell substrates in accordance with an embodiment of the present invention. As will be more apparent below, the system 100 is specifically adapted to coat an edge of a solar cell substrate, which typically has a non-circular shape. When a solar cell substrate is rotated, its non-circular shape creates a trajectory that makes it relatively difficult to follow the edge of the substrate with an applicator. Conventional approaches to edge coating solar cell substrates get around this issue by physically contacting the edge with a roller supplying the coating material.

In the example of FIG. 1, the system 100 includes a transport 110, an applicator system 120, and a vision system 160. A coating material supply system for feeding coating material to the applicator system 120 is not shown in FIG. 1 for clarity of illustration. An example material supply system that may be used with the system 100 is later described with reference to FIG. 7. Other material supply systems may also be used without detracting from the merits of the present invention.

The transport 110 may comprise a handling mechanism for moving a non-circular solar cell substrate 101 between a pre-alignment station 163 (see also FIG. 2) and a position where the applicator system 120 can coat the edge of the substrate 101, which in one embodiment comprises a semiconductor wafer with a pseudo-square shape. In the example of FIG. 1, the transport 110 comprises a commercially-available multi-axis robot.

The transport 110 may have an end portion that includes a cam 112 and a substrate support in the form of a chuck 113 for holding the substrate 101. The cam 112 may have the same shape as the substrate 101 but may have different (e.g., smaller) dimensions. The chuck 113 may hold the substrate 101 by vacuum force or other means. The chuck 113 may comprise hardened stainless steel, for example. During the edge coating process, the transport 110 positions the cam 112 such that it is in contact with a follower 123 of the applicator system 120.

The applicator system 120 comprises a mechanism for applying a coating material on the edge of the substrate 101. The applicator system 120 may comprise a coating applicator in the form of a roller 121, a rotational drive mechanism 122 configured to rotate the roller 121, and a slider assembly 124 configured to move the roller 121 towards and away from the substrate 101 along a single axis.

During the edge coating process, the transport 110 positions the substrate 101 to meet the applicator 120 as shown in FIG. 1. The slider assembly 124 moves up to push the follower 123 to contact the cam 112. An air spring 126 on the slider assembly 124 applies a relatively constant pressure on the follower 123 to contact the cam 112. The transport 110 rotates the substrate 101 to coat the edge of the substrate 101 with coating material from the roller 121. The drive mechanism 122 rotates the follower 123, which contacts and thereby follows the shape of the cam 112. The roller 121 is mechanically coupled to the follower 123 such that the roller 121 slides in and out by way of the air spring 126 in accordance with the mechanical interface between the follower 123 and the cam 112, thereby allowing the roller 121 to move in accordance with the shape of the substrate 101. The substrate 101 and the roller 121 may be rotated in the same or opposite direction with respect to each other at a speed which is dependent upon the ink type and properties (e.g., viscosity and adhesion). When rotating in the opposite directions, a typical speed for the substrate 101 is 250 deg/sec while for the roller 121 is 100-300 RPM.

The edge coating system 100 is "non-contact" in that the applicator, which is the roller 121 in this example, does not contact the edge of the substrate 101 during the edge coating process. In fact, in the example of FIG. 1, no hardware component of the system 100 contacts the edge of the substrate 101 while coating material is applied thereto. Instead, the substrate 101 is positioned within a recessed portion of the roller 121 in the form of a groove 125 (see FIGS. 4A and 4B) to receive edge coating material without any physical contact to the edge of the substrate 101. The coating material is applied to the groove 125 (see feed tube 411 in FIG. 4A) and then transferred to the edge of the substrate 101 by presence of the edge in the groove 125. Rotation of the substrate 101 by the transport 110 allows the entire perimeter edge of the substrate 101 to be coated.

The vision system 160 is configured to allow the transport 110 to correctly position the chuck 113 to pick up the substrate 101 from the station 163. The vision system 160 may comprise a camera 162, the station 163 and a lighting fixture 164. A computer system 161 is configured to control the operation of the system 100, including the vision system 160, the applicator system 120, and the transport 110. Some components of FIG. 1 are also shown in FIGS. 2 and 3 for clarity of illustration.

Figure 2:
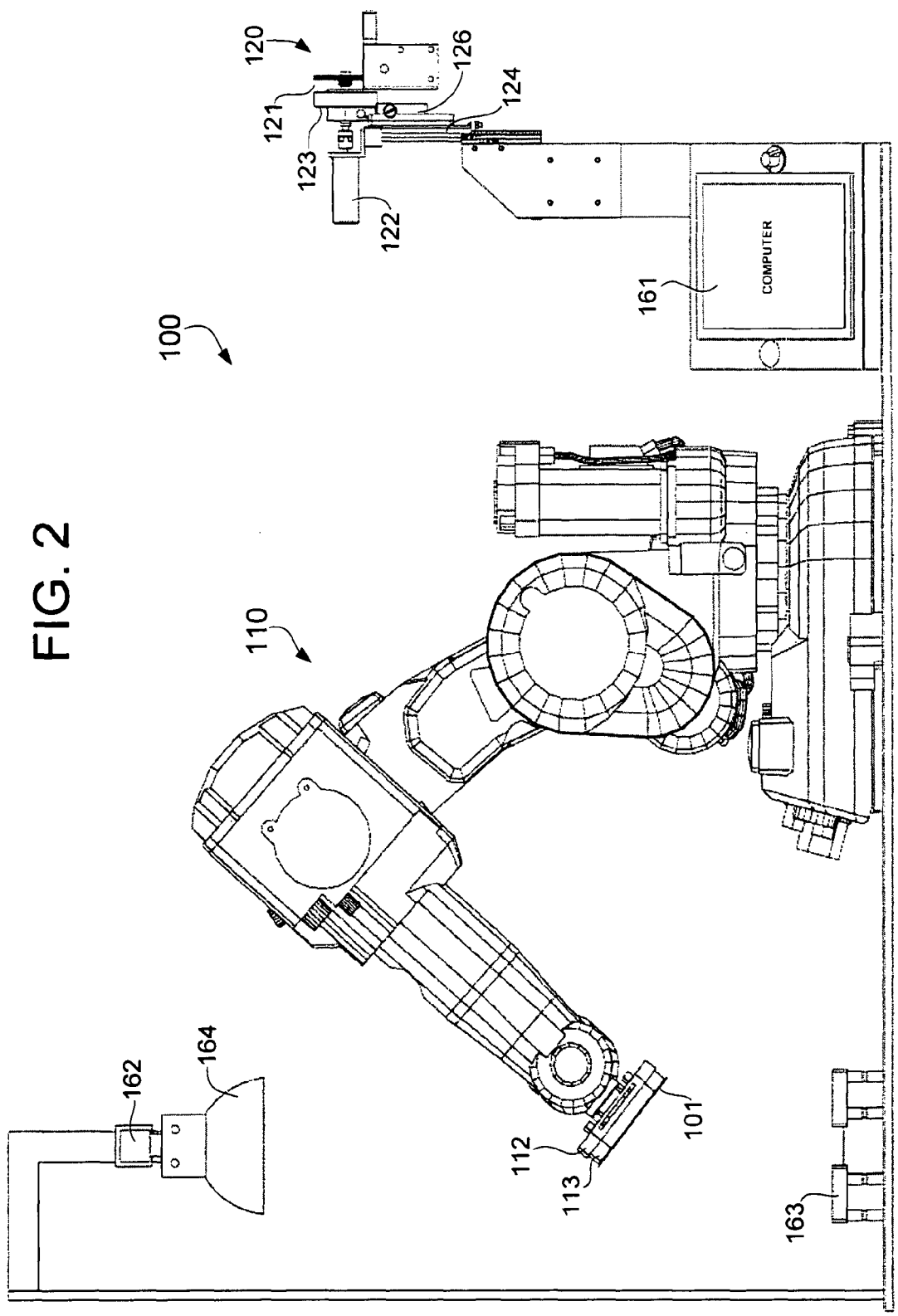
FIGS. 2 and 3 show side views of the non-contact edge coating system of FIG. 1.
Figure 3:
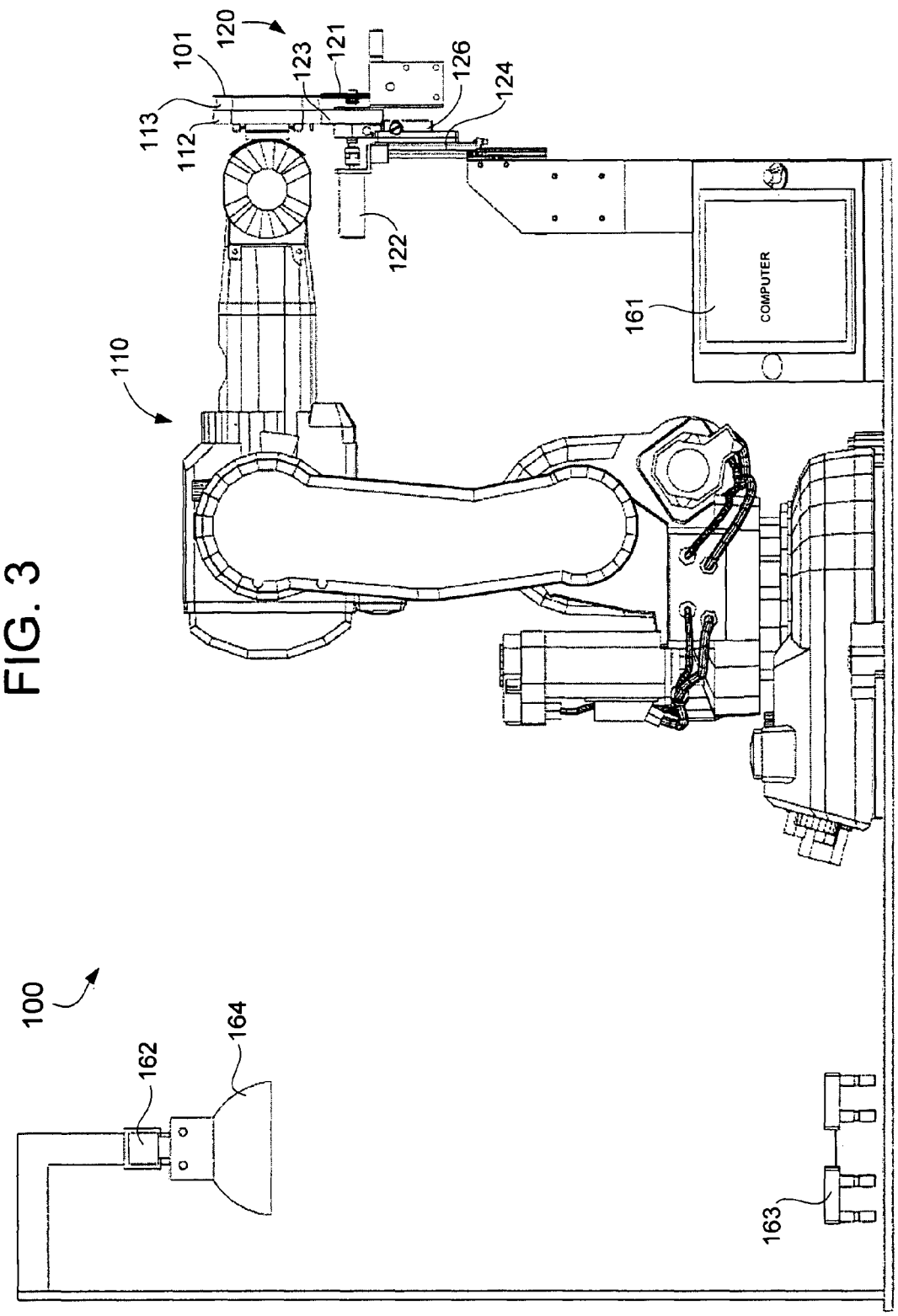

Referring to FIG. 2, the substrate 101 is positioned in the station 163 manually by a production operator or by an automated handling system (not shown). The station 163 is in a fixed coordinate relative to the transport 110 for ease of location. The station 163 is also shaped to allow the substrate 101 to be pre-aligned relative to the transport 110, simplifying pick-up and alignment of the substrate 101 with respect to the chuck 113 and thus cam 112. The vision system 160 takes an image of the substrate 101 in the station 163 and analyzes the image to find the center of the substrate surface and determine the orientation of the substrate 101. The computer 161, with its control software, uses the information from the vision system 160 to allow the transport 110 to locate and pick up the substrate 101 such that the center of the surface area of the substrate 101 is coincident with the center of surface area of the chuck 113. Having located and aligned the substrate 101 relative to the chuck 113, the transport 110 then picks up the substrate 101 as shown in FIG. 2 and positions it for edge coating with the applicator system 120 as shown in FIG. 3. The transport 110 places the substrate 101 back to the station 163 after the edge coating process. The vision system 160 may be implemented using commercially available components without detracting from the merits of the present invention.

Figure 4A:
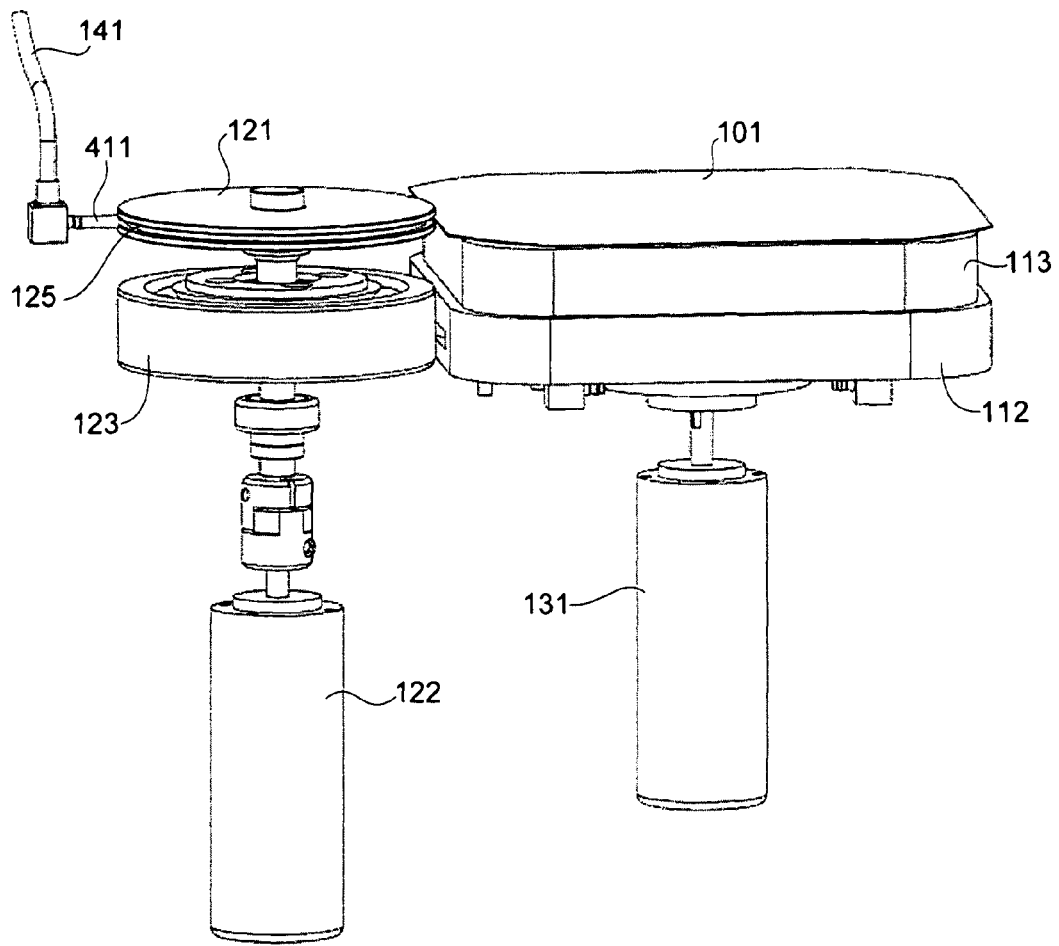
FIGS. 4A and 4B show a perspective view and a side view, respectively, of portions of the non-contact edge coating system of FIG. 1.

FIG. 4A shows a perspective view of the roller 121 relative to the substrate 101 during the edge coating process. Coating material is supplied to the groove 125 of the roller 121 by way of a feed tube 411. The feed tube 411 receives coating material from a material supply tank (see 142 in FIG. 7) by way of a flexible supply tube 141. The drive 122 rotates the follower 123 and the roller 121 while coating material is fed to the groove 125. The substrate 101 is held by the chuck 113, which is mechanically coupled to the cam 112. During the edge coating process, a rotational drive 131 in the transport 110 rotates the cam 112 to thereby rotate the substrate 101. The edge of the substrate 101 is positioned in the groove 125 to receive coating material. Excess coating material is removed by a doctor blade (not shown). The center of the substrate 101 is in a relatively fixed position during the edge coating process. The rotational drive 131 rotates the cam 112 together with the chuck 113 and the substrate 101. The air spring 126 (see FIG. 3) pushes the follower 123 to follow the cam 112 such that the roller 121 follows the shape of the substrate 101.

Figure 4B:
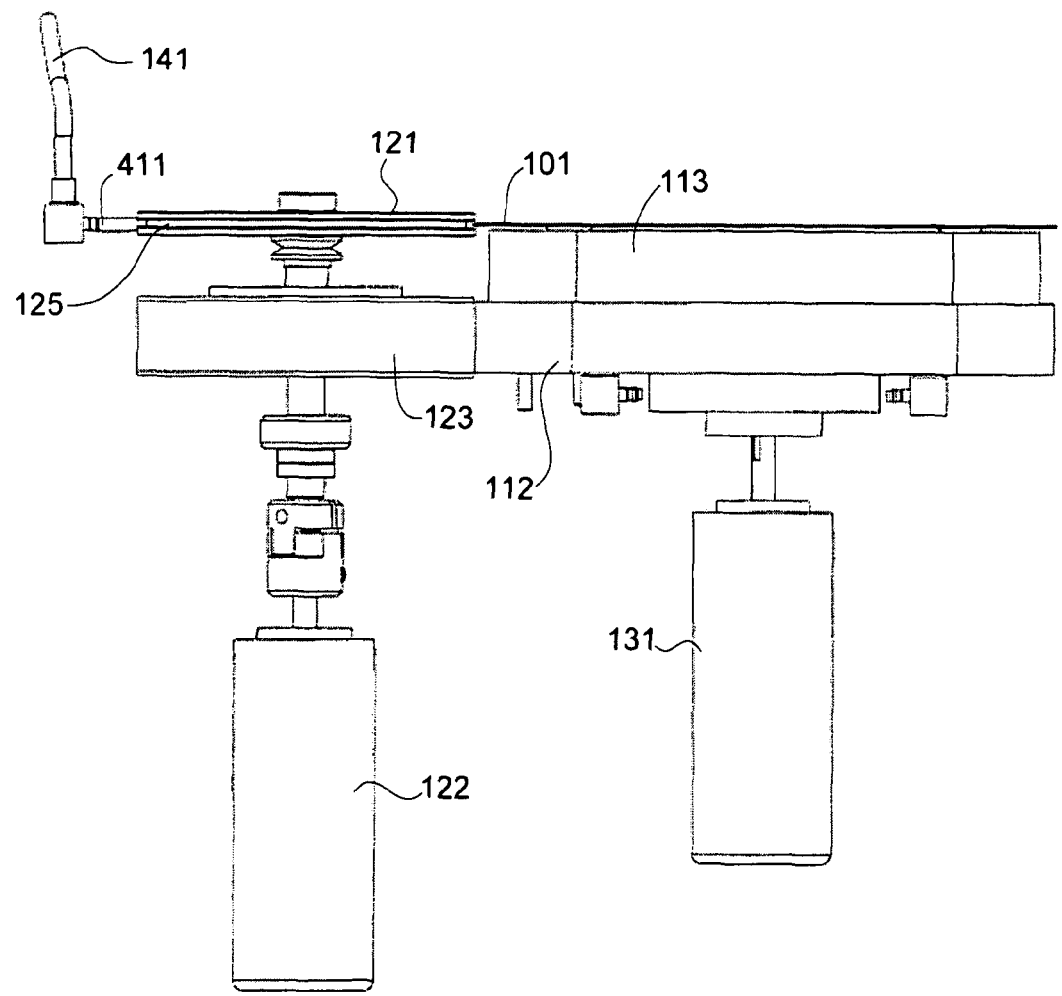

FIG. 4B shows a side view of the roller 121 relative to the substrate 101 during the edge coating process. Note that the edge of the substrate 101 does not physically contact the roller 121 during edge coating. Instead, the edge of the substrate 101 is received in the groove 125. Because the shape of the cam 112 approximates or is the same as the substrate 101, and the follower 123 is in mechanical contact with the cam 112, the roller 121 is able to apply coating material to the edge of the substrate 101 without physical contact.

Figure 5A:
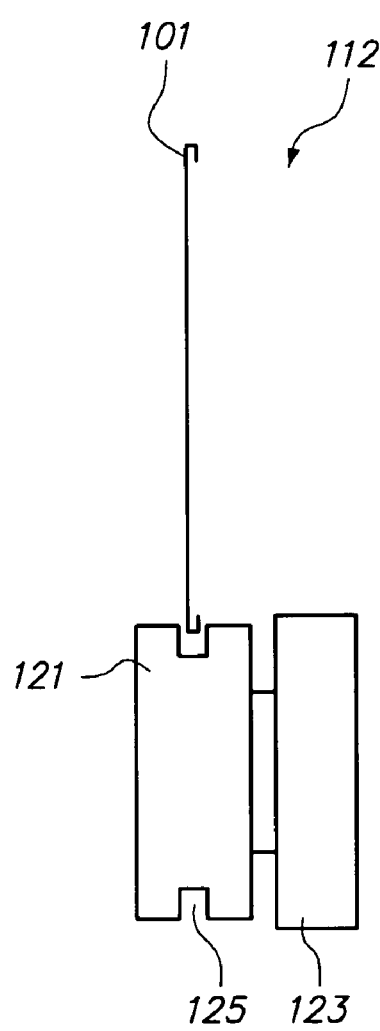
FIGS. 5A and 5B schematically show a side view and a top view, respectively, of a roller relative to a solar cell substrate during an edge coating process in accordance with an embodiment of the present invention.
Figure 5B:
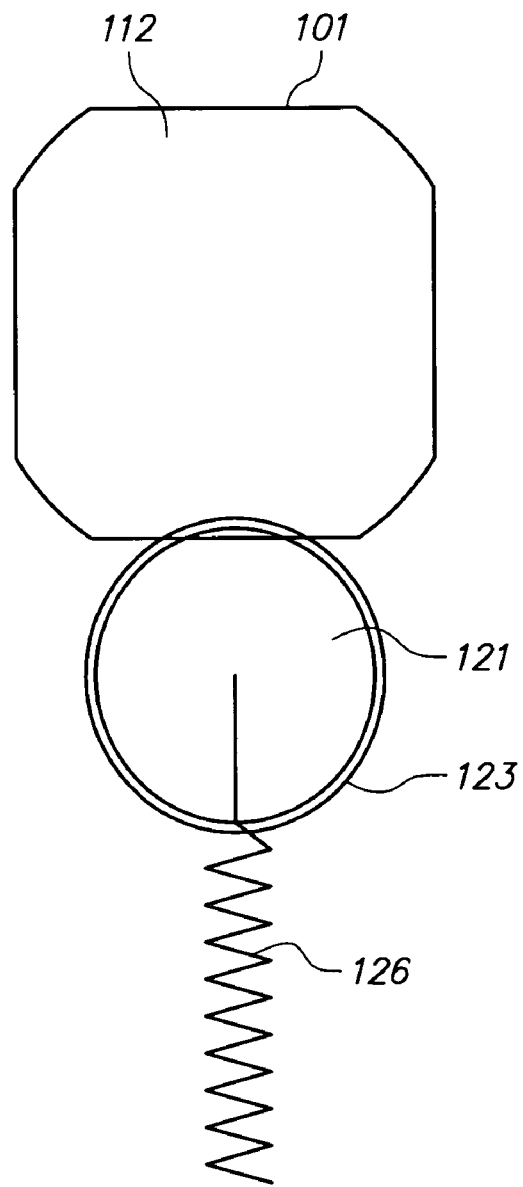

FIGS. 5A and 5B schematically show a side view and a top view, respectively, of the roller 121 relative to the substrate 101 during the edge coating process. FIG. 5B schematically shows the air spring 126 of the slider assembly 124 applying a relatively constant force to the follower 123, allowing the follower 123 to move to follow the shape of the cam 112. The edge of the substrate 101 is positioned in the groove 125 without touching a surface of the groove 125 or other portions of the roller 121.

Figure 6A:
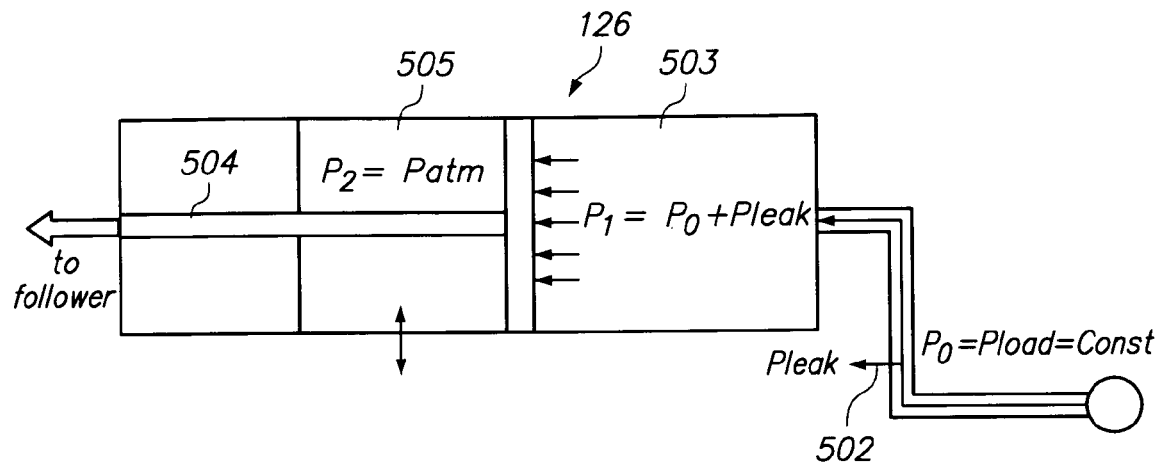
FIGS. 6A and 6B schematically show the principle of operation of a conventional air spring that may be employed in embodiments of the present invention.
Figure 6B:
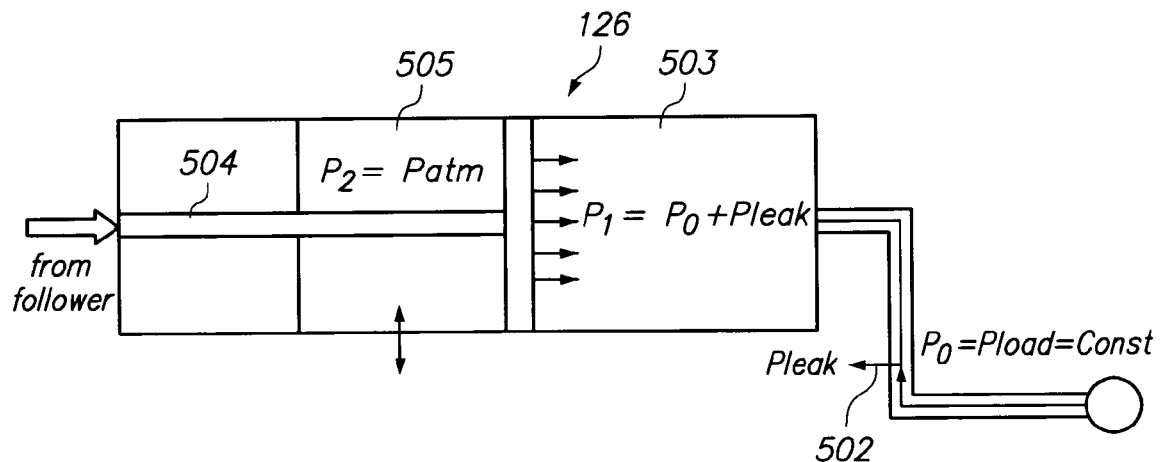

FIGS. 6A and 6B schematically show the principle of operation of a conventional air spring 126 that may be employed in embodiments of the present invention. In the example of FIGS. 6A and 6B, the air spring 126 is configured to keep the pressure P1 and thus the force applied to the follower 123 relatively constant independent of the profile of the cam 112. A pressure P0 equal to the load pressure $P_{LOAD}$ is applied to the air spring 126 using an air supply system that includes a small vent 502 with an air leak with corresponding leak pressure $P_{LEAK}$. Because of the air leak, the total pressure applied in the pressurized chamber 503 of air spring 126 is P1=P0−$P_{LEAK}$. The chamber 505 of the air spring 126 on the other side of the chamber 503 is at atmospheric pressure. Accordingly, no pressure or resistance is applied in the chamber 505. The piston 504 is in contact with the follower 123. When the follower 123 is pushing against the flat or middle portion of the cam, the air spring 126 applies an active force on the follower 123, pushing the follower 123 to contact the cam 112 as illustrated in FIG. 6A. When the cam 112 rotates such that its corner edge is in contact with the follower 123, the cam 112 pushes the follower 123 back to apply a force on the air spring 126 as illustrated in FIG. 6B. In the case of FIG. 6B, the air volume in the chamber 503 decreases, increasing the pressure P1 in the chamber 503. This causes some air to flow out of the vent 502, keeping the pressure P1 in the chamber 503 relatively constant.

Figure 7:
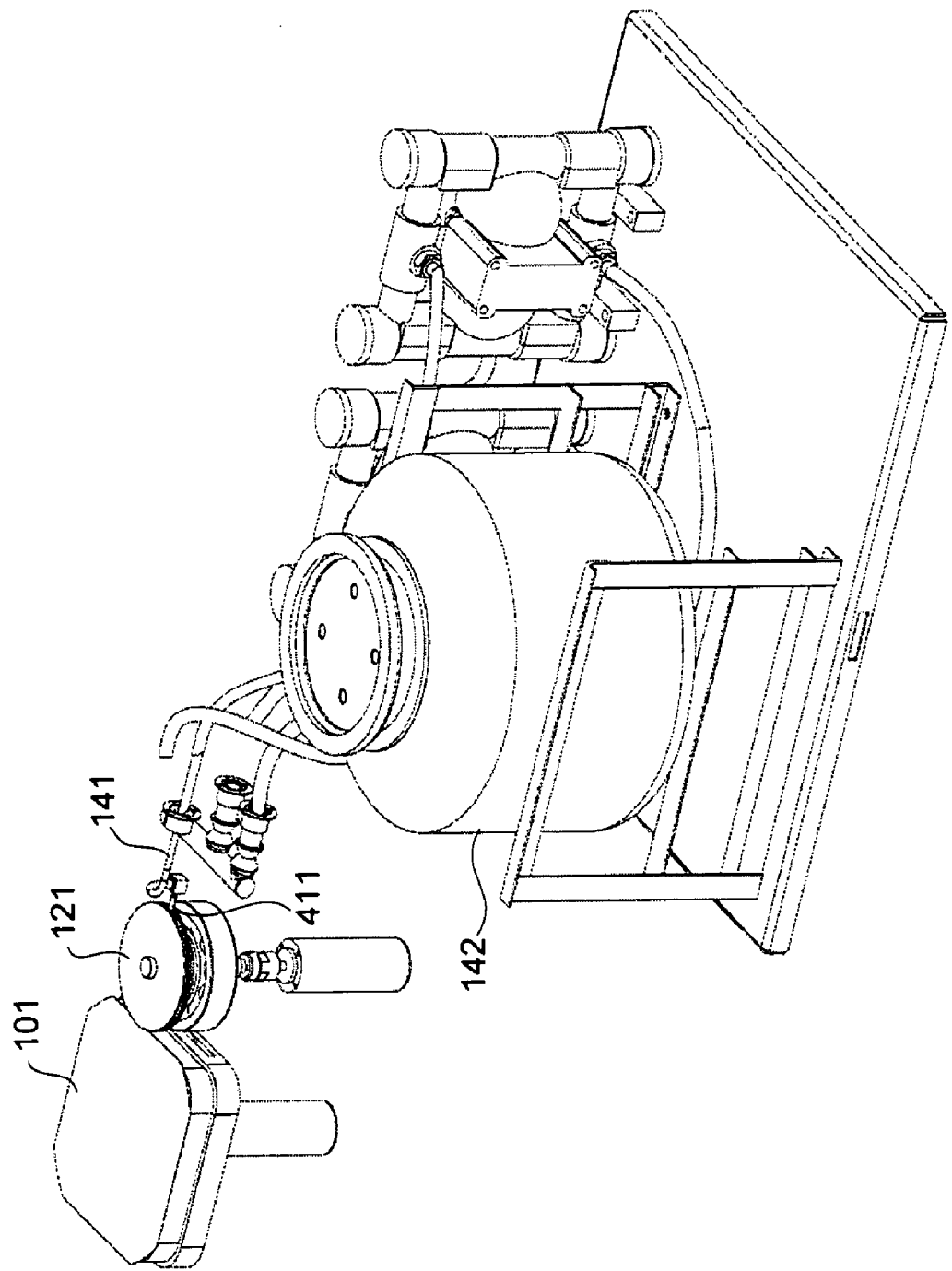
FIG. 7 shows a perspective view of a coating material supply system in accordance with an embodiment of the present invention.

FIG. 7 shows a perspective view of a coating material supply system in accordance with an embodiment of the present invention. In the example of FIG. 7, the material supply system includes a material supply tank 142 containing the coating material. Coating material from the tank 142 is flowed to the feed tube 411 by way of a flexible supply tube 141. The feed tube 411 flows the coating material to the roller 121, which applies the coating material to the edge of the substrate 101 without physical contact.

In one embodiment, the non-circular substrate 101 comprises a semiconductor wafer having a pseudo square shape (e.g., see substrate 101 in FIG. 7). Assuming the center of the wafer is coincident with the center of the surface of the cam, the width of the coating material applied to round corners of the wafer is described by:

$$\text{COATING WIDTH} = \frac{\text{Wafer Diameter} - CAM \text{ Diameter}}{2} - \frac{\text{Follower Diameter} - RollerDiameter}{2}$$

while the width of the coating material applied to the flat edge portions of the wafer is described by:

$$\text{COATING WIDTH} = \frac{\text{Wafer width} - CAM \text{ width}}{2} - \frac{\text{Follower Diameter} - RollerDiameter}{2}$$

If the center of the wafer is not coincident with the center of the surface of the cam, the width of the coating material applied to the edge of the wafer in general is described by:

$$\text{COATING WIDTH} = \frac{\text{Wafer Diameter} - CAM \text{ Diameter}}{2} - \frac{\text{Follower Diameter} - RollerDiameter}{2} \pm$$

distance between wafer surface center and cam surface center

From the foregoing, the coating width can be configured for a particular application by design choice of the cam diameter, follower diameter, roller diameter, and cam width for a given wafer diameter.

As can be appreciated, the non-contact edge coating system 100 may employ various coating materials without detracting from the merits of the present invention. For example, the edge coating system 100 may employ thermal ink. Preferably, however, the edge coating system 100 employs a coating material that does not need to be cured or dried in a large oven. In one embodiment, the coating material comprises hot melt ink comprising a wax, such as those available from SunJet. When using hot melt ink, the tank 142 and associated hoses, tubing system, and feed tube are preferably heated.

In another embodiment, the coating material comprises a UV (ultraviolet) curable plating resist. UV curable plating resist may be cured by exposure to an LED (light emitting diode) system with a focused beam, such as a spot cure LED or a liquid light guide. Spot cure LED and liquid light guide are commercially available from, for example, UV Process Supply, Inc. Another possible curing method is provided by using commercially available UV lamps or bulbs from, for example, Fusion UV Systems Inc or Dymax Corporation. UV curable plating resist, also referred to as "UV ink," has several advantages as an edge coating material for solar cells including low heat requirement to avoid liquefying hot melts deposited in previous processing steps and focused UV curing that is limited to a specific area to avoid UV exposure of the front of the solar cell. As will be more apparent below, UV curable plating resist has the additional advantage of requiring a small curing component that can readily mounted in an applicator system.

Figure 8:
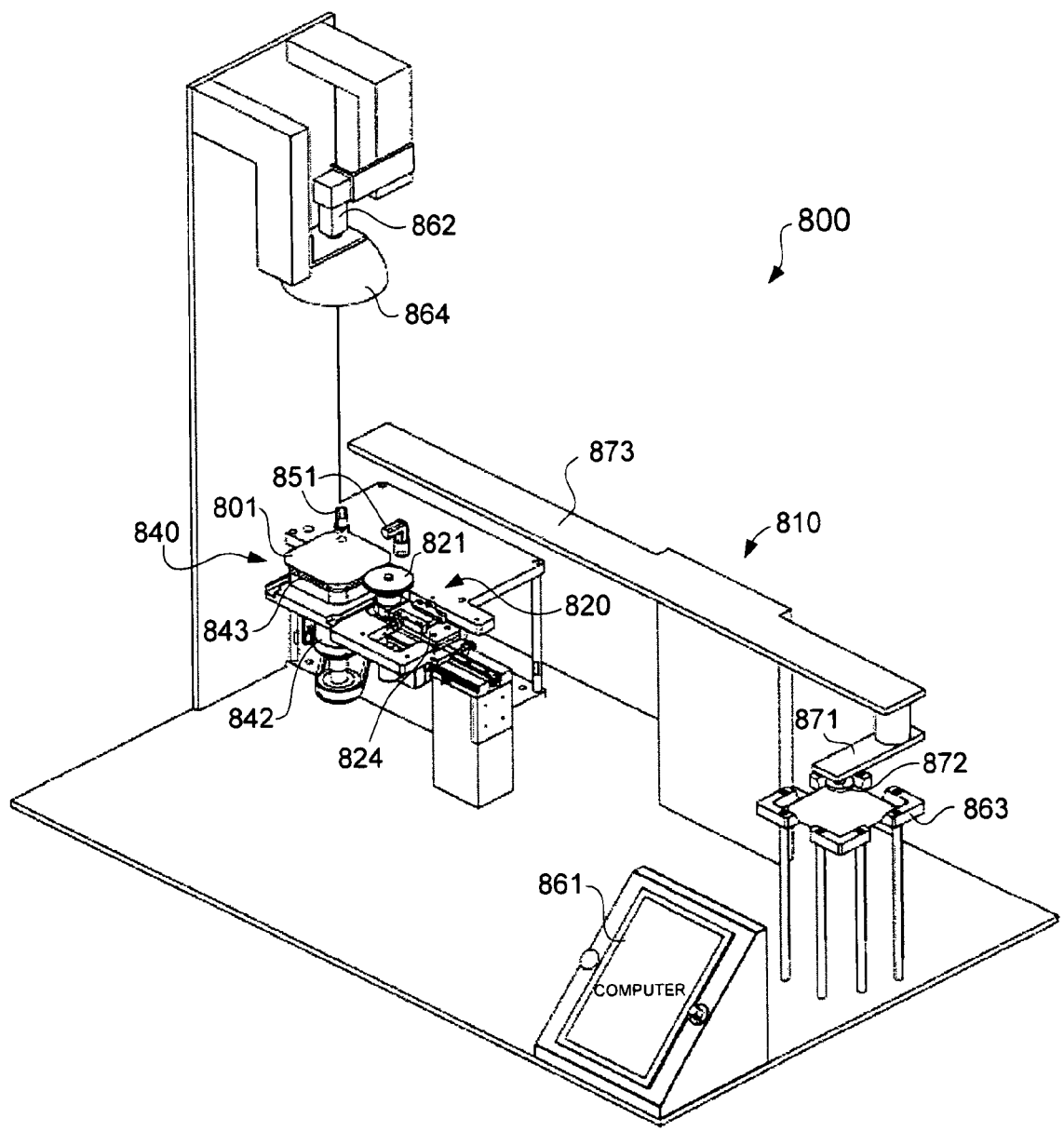
FIG. 8 shows a non-contact edge coating system for solar cells in accordance with another embodiment of the present invention.

Referring now to FIG. 8, there is shown a non-contact edge coating system 800 in accordance with another embodiment of the present invention. Like the system 100, the system 800 is non-contact in that it is configured to apply coating material to a non-circular solar cell substrate 801 without the applicator, a roller 821 in the example of FIG. 1, physically touching the substrate 801. Unlike the system 100, however, the system 800 positions the applicator relative to the substrate using electronic control means rather than a mechanical arrangement.

In the example of FIG. 8, the non-contact edge coating system 800 comprises a transport 810, an applicator system 820, a workpiece holding assembly 840, a control system 900 (see FIG. 12), a pre-alignment station 863, and curing components 851. A coating material supply system for feeding coating material to the applicator system 820 is not shown in FIG. 8 for clarity of illustration. An example material supply system that may be used with the system 800 is previously described with reference to FIG. 7. Other material supply systems may also be used without detracting from the merits of the present invention.

The transport 810 may comprise a handling mechanism for moving a non-circular solar cell substrate 801 between a pre-alignment station 863 and a position where the applicator system 820 can coat the edge of the substrate 801. The substrate 801 may comprise a semiconductor wafer having a pseudo-square shape.

In the example of FIG. 8, the transport 810 comprises a pick and place robot. The transport 810 may include a beam 873 and an arm 871 with an end-effector 872. The end-effector 872 may be lowered and raised to pick-up or place the substrate 801. The end-effector 872 may hold the substrate 801 by vacuum force.

The substrate 801 may be positioned in a pre-alignment station 863 manually by a production operator or by an automated handling system (not shown). The station 863 is in a fixed coordinate relative to the transport 810 for ease of location. The station 863 is also shaped to allow the substrate 801 to be pre-aligned relative to the transport 810, simplifying pick-up and alignment of the substrate 801. In operation, the transport 810 picks up the substrate 801 from the station 863, slides along the beam 873 towards the applicator system 820, and then places the substrate 801 onto the holding assembly 840. The transport 810 performs the reverse operation to place the substrate 801 back into the station 863 after the edge coating process.

The holding assembly 840 may be configured to support and hold the substrate 801. The holding assembly 840 may comprise a substrate support in the form of a chuck 843 for holding the substrate 801 by, for example, vacuum force. The holding assembly 840 may further include a rotational drive 842 for rotating the chuck 843, and thus the substrate 801, in place. The center of the chuck 843 may be in a fixed coordinate and accordingly does not move during edge coating.

The applicator system 820 may comprise an applicator in the form of a roller 821, which rides on a single-axis slider assembly 824. The roller 821 includes a recessed portion in the form of a groove 825 (see FIGS. 11A and 11B) that receives the edge of the substrate 801. As will be more apparent below, the slider assembly 824 moves the roller 821 along a single axis to coat the edge of the substrate 801 without physically touching the edge of the substrate 801. The coating material is applied to the groove 825 (see feed tube 811 in FIG. 11A) and then transferred to the edge of the substrate 801 by presence of the edge in the groove 825. Rotation of the substrate 801 by the rotational drive 842 allows the entire perimeter edge of the substrate 801 to be coated. The curing components 851 may comprise a spot cure LED or other means for curing UV curable plating resist used as coating material. Other coating materials, such as thermal ink and hot melt ink may also be used without detracting from the merits of the present invention.

The control system 900 may include a camera 862 for taking images of the substrate 801 on the chuck 843, a lighting fixture 864 for providing a light source for the camera 862, and a computer 861 for processing images taken by the camera 862 and driving the slider assembly 824 towards and away from the substrate 801 such that the roller 821 applies coating material to the edge of the substrate 801 without physically contacting the edge of the substrate 801. The control system 900 is further described with reference to FIG. 12.

Figure 9:
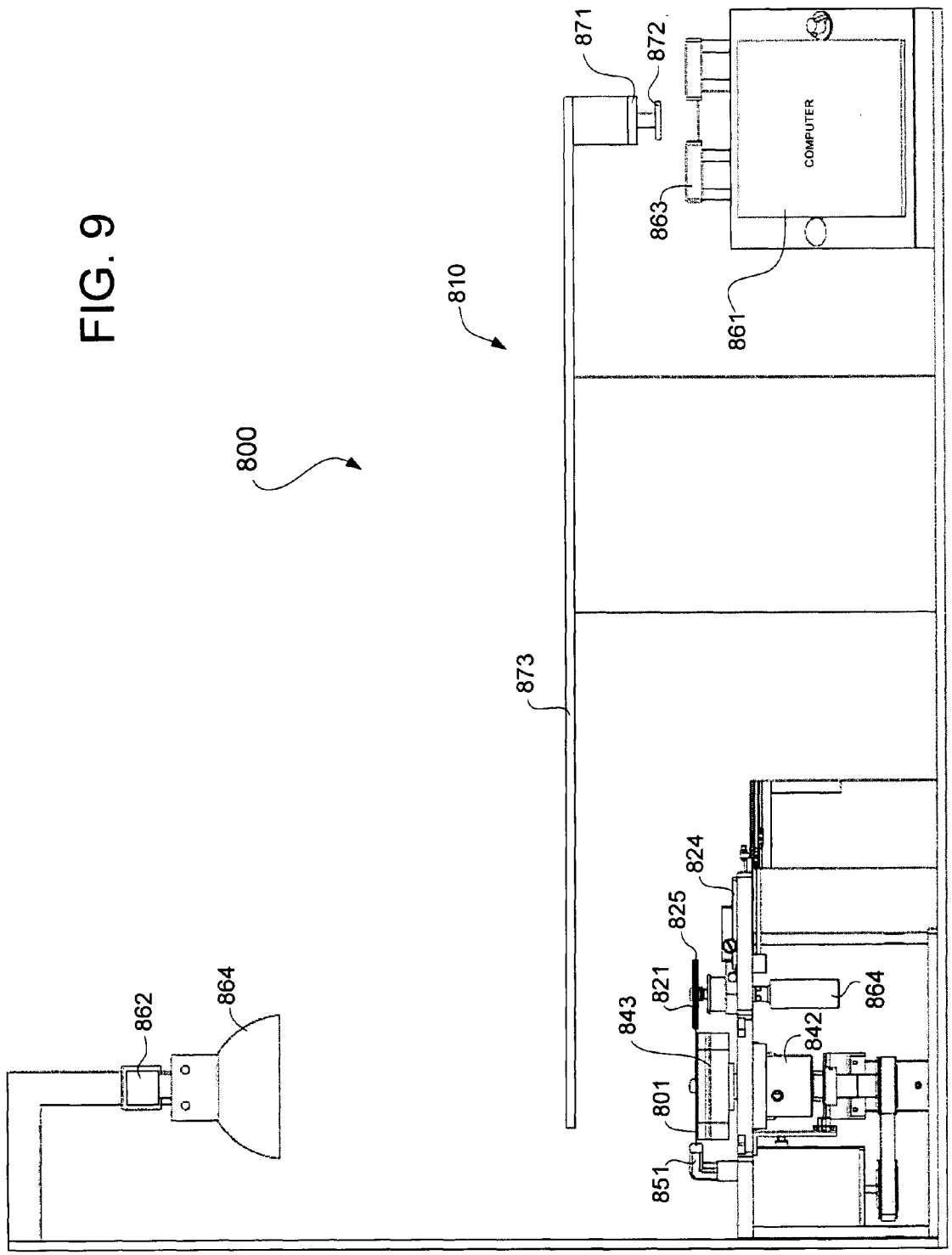
FIGS. 9 and 10 show a side view and a top view, respectively, of the non-contact edge coating system of FIG. 8.
Figure 10:
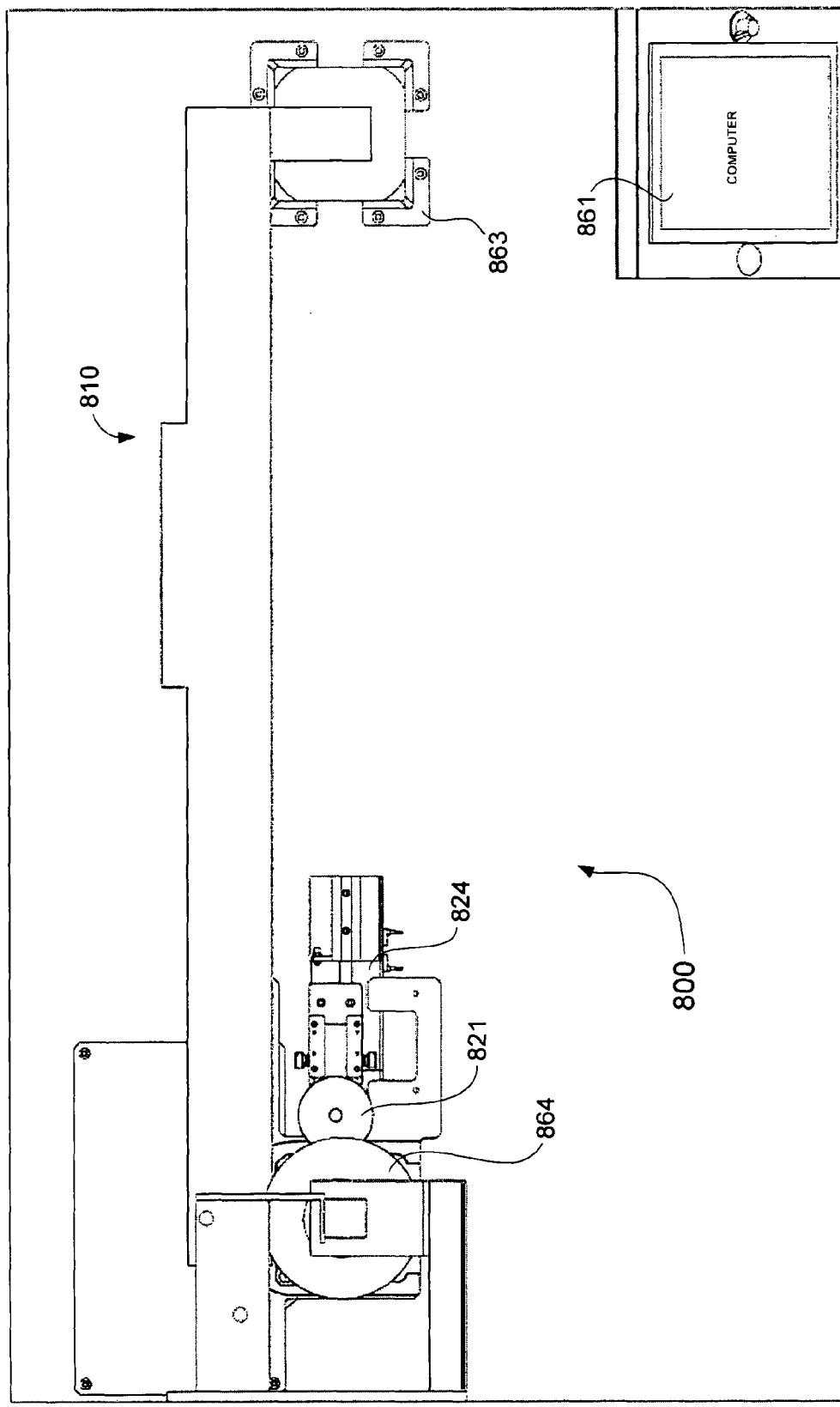

FIGS. 9 and 10 show a side view and a top view, respectively, of the system 800. The components labeled in FIGS. 9 and 10 have been previously described with reference to FIG. 8.

Figure 11A:
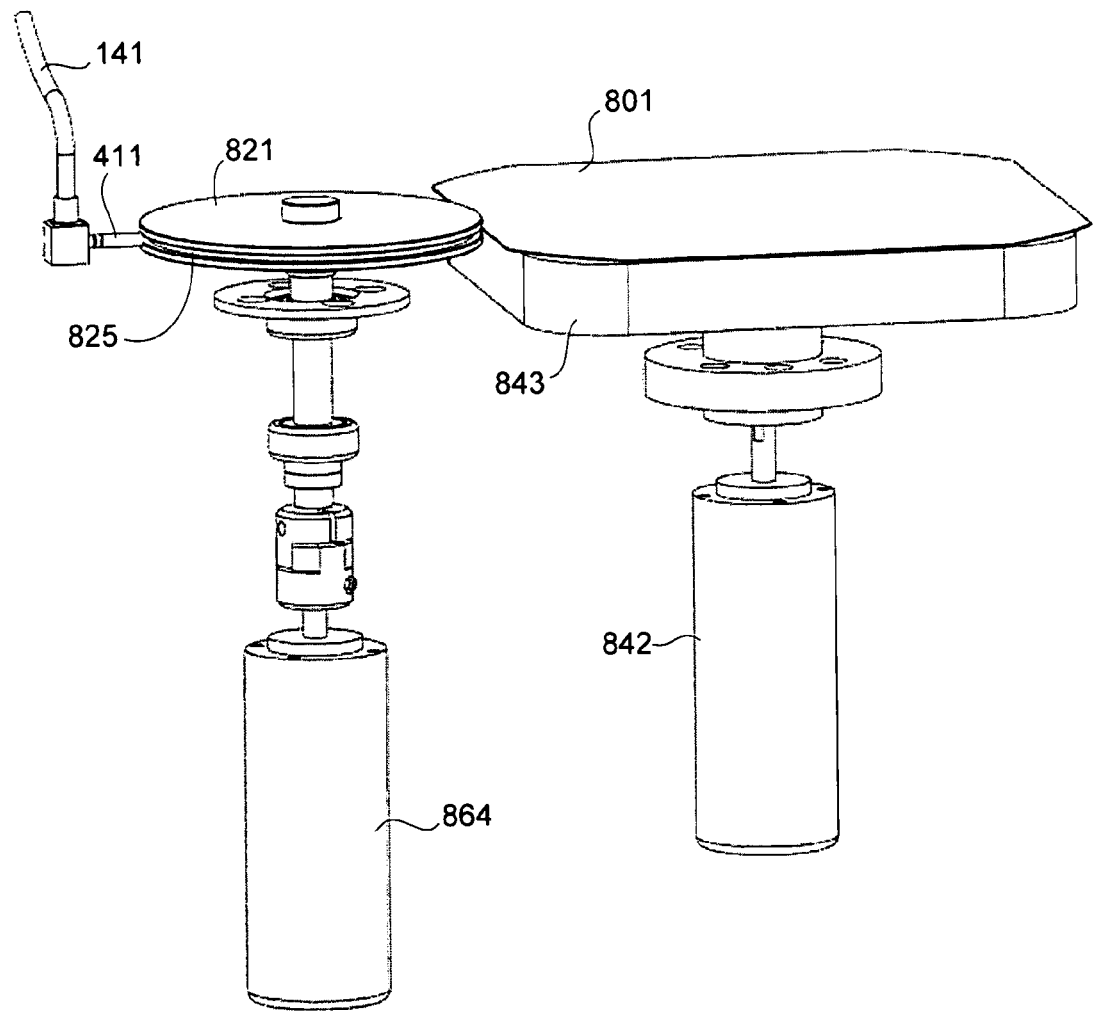
FIGS. 11A and 11B show a perspective view and a side view, respectively, of portions of the non-contact edge coating system of FIG. 8.
Figure 11B:
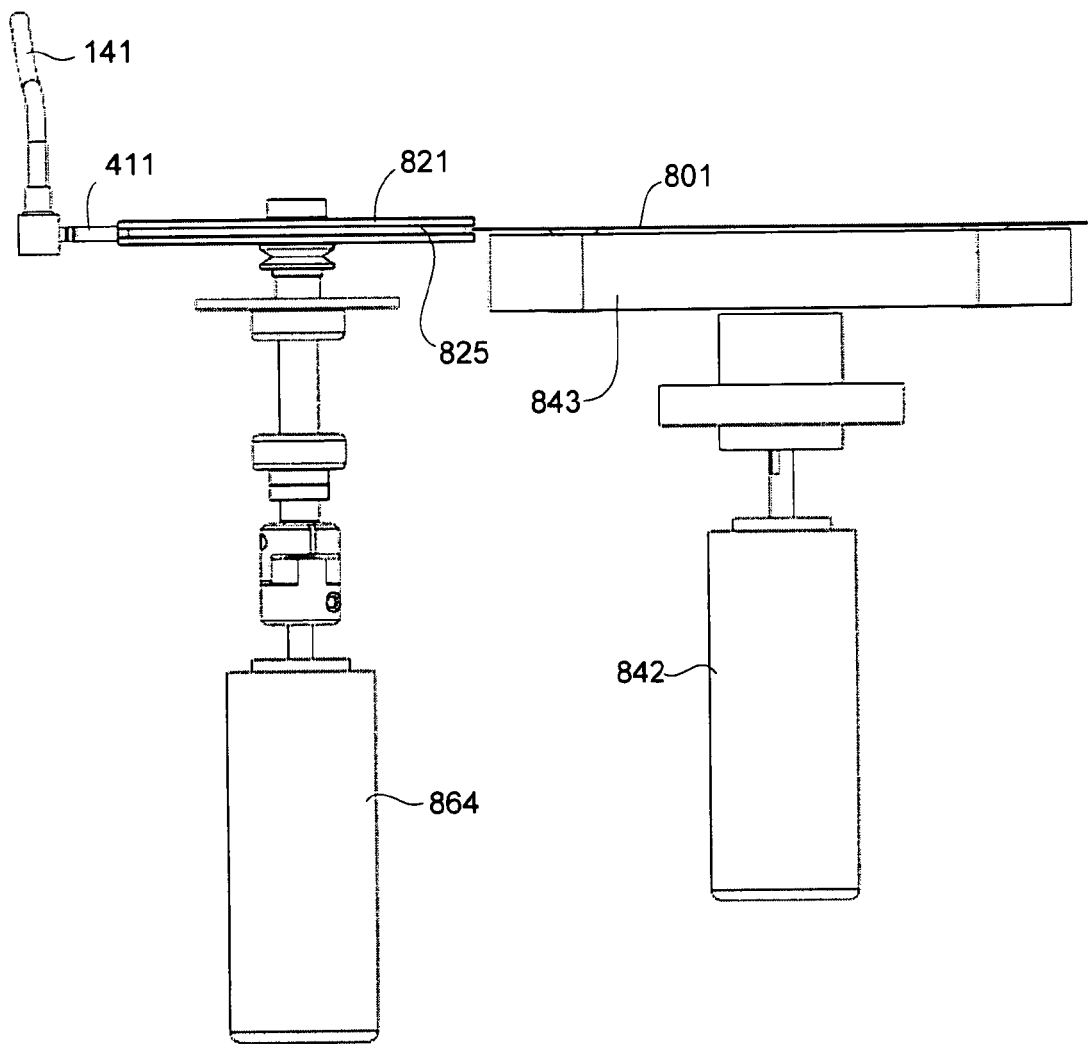

FIGS. 11A and 11B show a perspective view and a side view, respectively, of the roller 821 relative to the substrate 801 during an edge coating process. Coating material is applied to the groove 825 by way of a feed tube 411, which receives coating material by way of the flexible supply tube 141 (see also FIG. 7). The edge of the substrate 801 receives the coating material in the groove 825. The chuck 843 is rotated by the rotational drive 842 (see FIGS. 8 and 9) to rotate the substrate 801, allowing the entire perimeter edge of the wafer to be coated with the coating material, at about 100-300 RPM 200-370 degree/sec. As shown in FIGS. 11A and 11B, the edge of the substrate 801 is received in the groove 825 but does not contact any portion of the roller 821 or any hardware component of the system 800 during the edge coating process.

Figure 12:
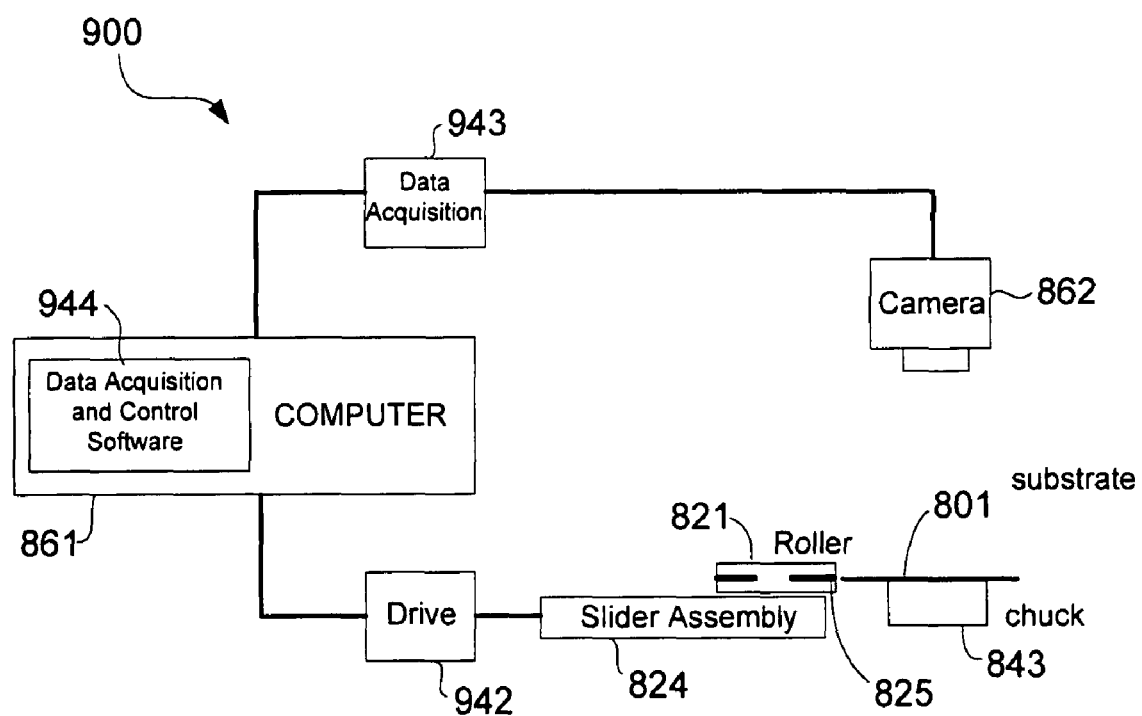
FIG. 12 schematically shows a control system for the non-contact edge coating system of FIG. 8 in accordance with an embodiment of the present invention.

FIG. 12 schematically shows the control system 900 for the non-contact edge coating system 800 in accordance with an embodiment of the present invention. In the example of FIG. 12, the control system 900 includes the computer 861, the camera 862, a drive module 942, a data acquisition module 943, and corresponding data acquisition and control software 944.

The data acquisition module 943 may be configured to receive images taken by the camera 862 and convert the images to a form that can be read and processed by the computer 861. The drive module 942 may be configured to receive control signals from the computer 861 for driving the slider assembly 942, and thus the roller 821 along a single axis. The data acquisition and control software 944 may comprise computer-readable program code for processing images taken by the camera 862 and outputting corresponding control signals to drive the roller 821. In operation, the control system 900 operates as a closed loop servo for driving the roller 821 towards and away from the substrate 801 to coat the edge of the substrate 801 without physical contact.

Prior to the edge coating process, the software 944 commands the data acquisition module 943 to take an image of the substrate 801 on the chuck 843 to locate points on the edge ("edge points") of the substrate 801. During the edge coating process, the software 944 keeps track of the edge points and sends corresponding control signals to the drive module 942 to move the slider assembly 824 such that the roller 821 follows the edge points at a coating distance given the rotational speed of the substrate 801. This way, the control system 900 keeps a coating distance between the end surface of the groove 825 of the roller 821 and the edge of the substrate 801 despite the non-circular shape of the substrate 801.

Figure 13A:
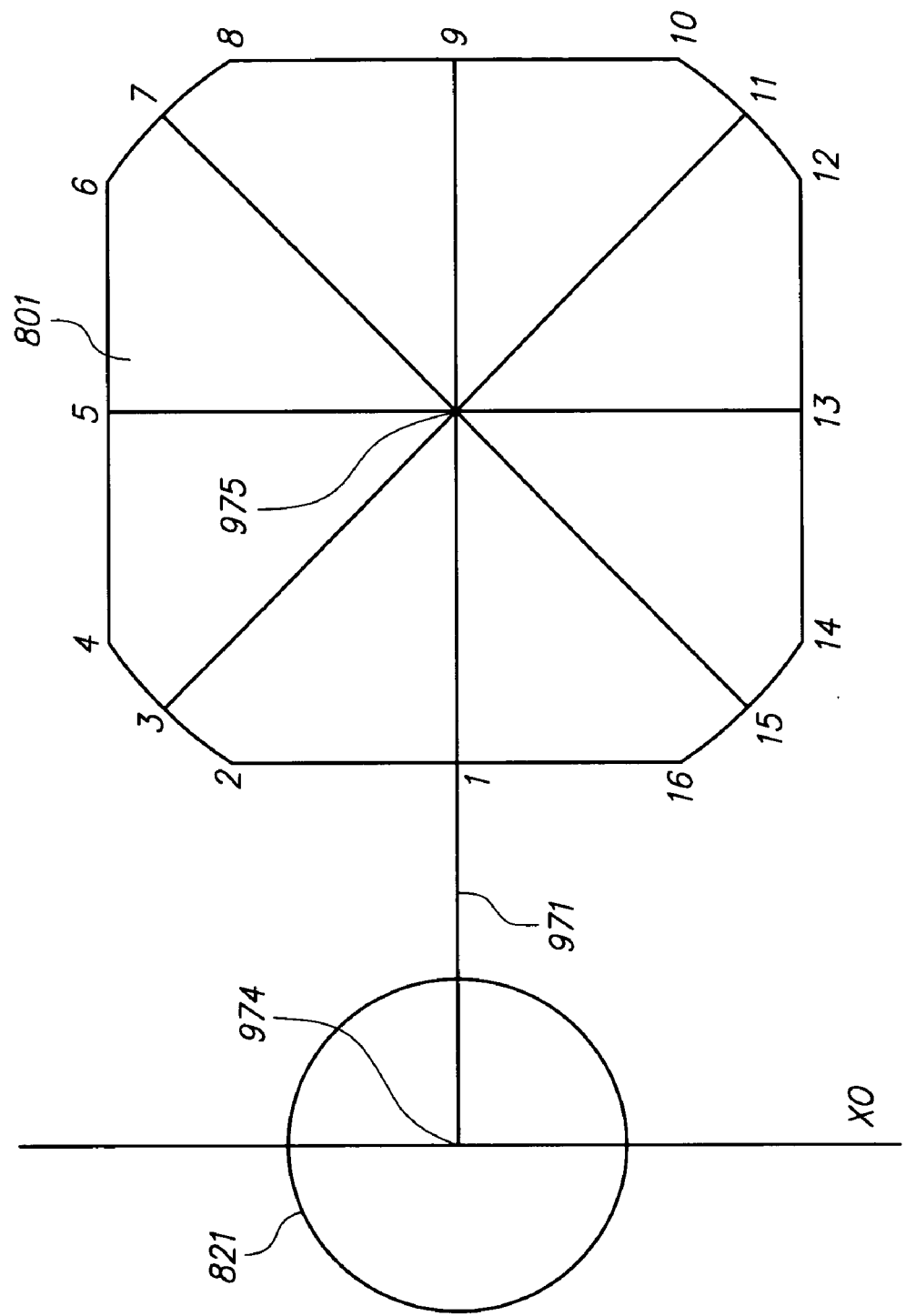
FIGS. 13A, 13B, 13C, and 13D schematically illustrate the movement of a roller along an axis during an edge coating process in accordance with an embodiment of the present invention.

FIGS. 13A, 13B, 13C, and 13D schematically illustrate the movement of the roller 821 along a single axis 971 during the edge coating process in accordance with an embodiment of the present invention. In FIG. 13A, the control system 900 locates edge points 1-16 of the substrate 801 prior to edge coating. At this time, the center of the roller 821 is at a location 974 along the axis 971 (see also, position X0 on the horizontal axis), and is away from the substrate 801. In the example of FIGS. 13A, 13B, 13C, and 13D, the center 975 of the substrate 801 is at a fixed coordinate coincident with the axis 971.

Figure 13B:
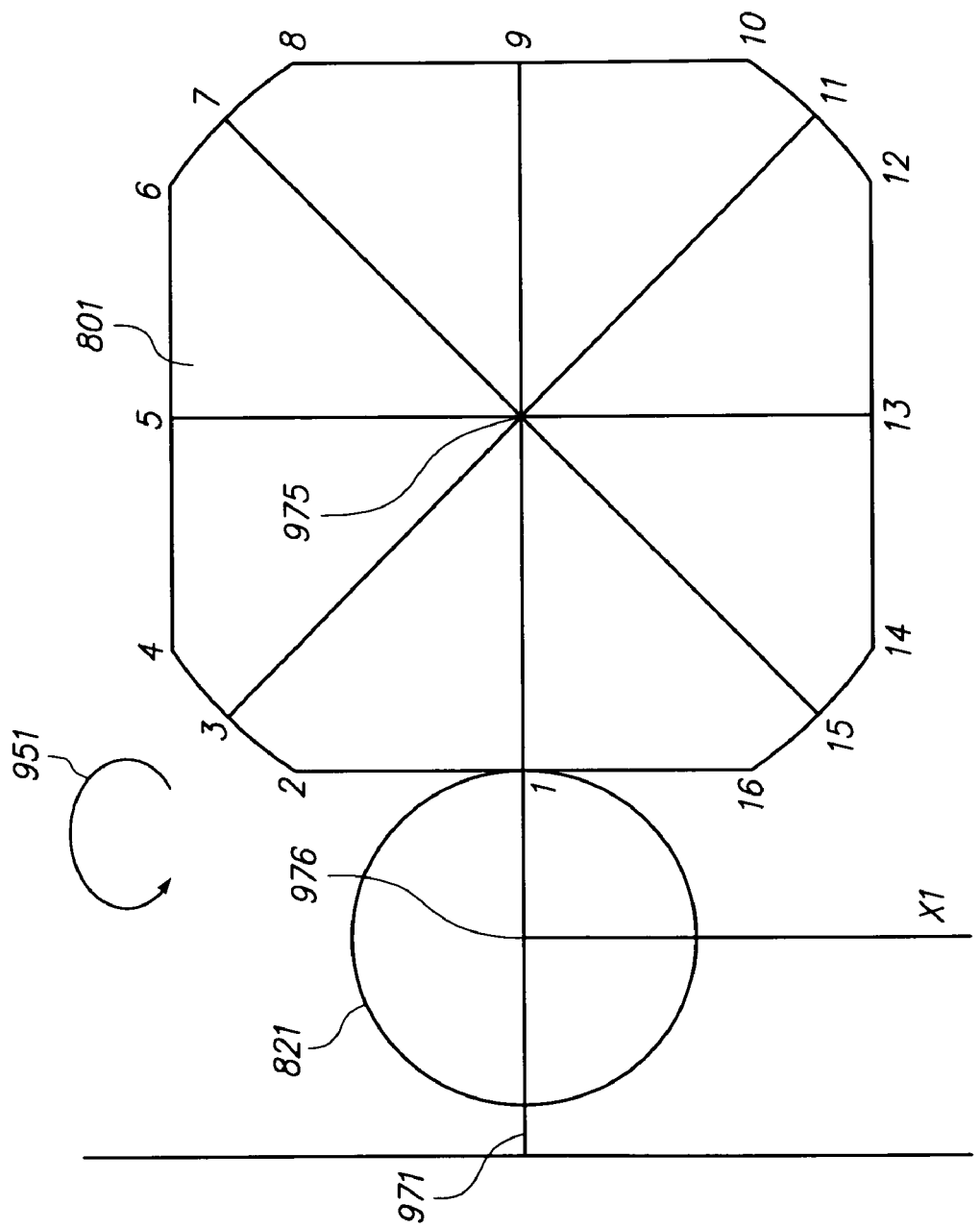

In FIG. 13B, the control system 900 moves the roller 821 in a position to apply a coating material to the edge of the substrate 801. The roller 821 and the substrate 801 are then rotated in the same direction, which in this example is counter-clockwise (see arrow 951). When the edge point 1 of the substrate 801 is on the axis 971, the control system 900 positions the center of the roller 821 at a location 976 (see also, position X1 on the horizontal axis) along the axis 971 to have a coating distance with the edge of the substrate. In general, the control system 900 keeps track of the edge points 1-16 during rotation of the substrate 801. Knowing the fixed coordinates of the center 975 about which the substrate 801 is rotated and location of the edge points 1-16, the control system 900 calculates and keeps track of the entire perimeter of the edge of the substrate 801 while it is rotated, and moves the roller 821 relative to the edge of the substrate 801 to maintain the coating distance without physically contacting the edge.

Figure 13C:
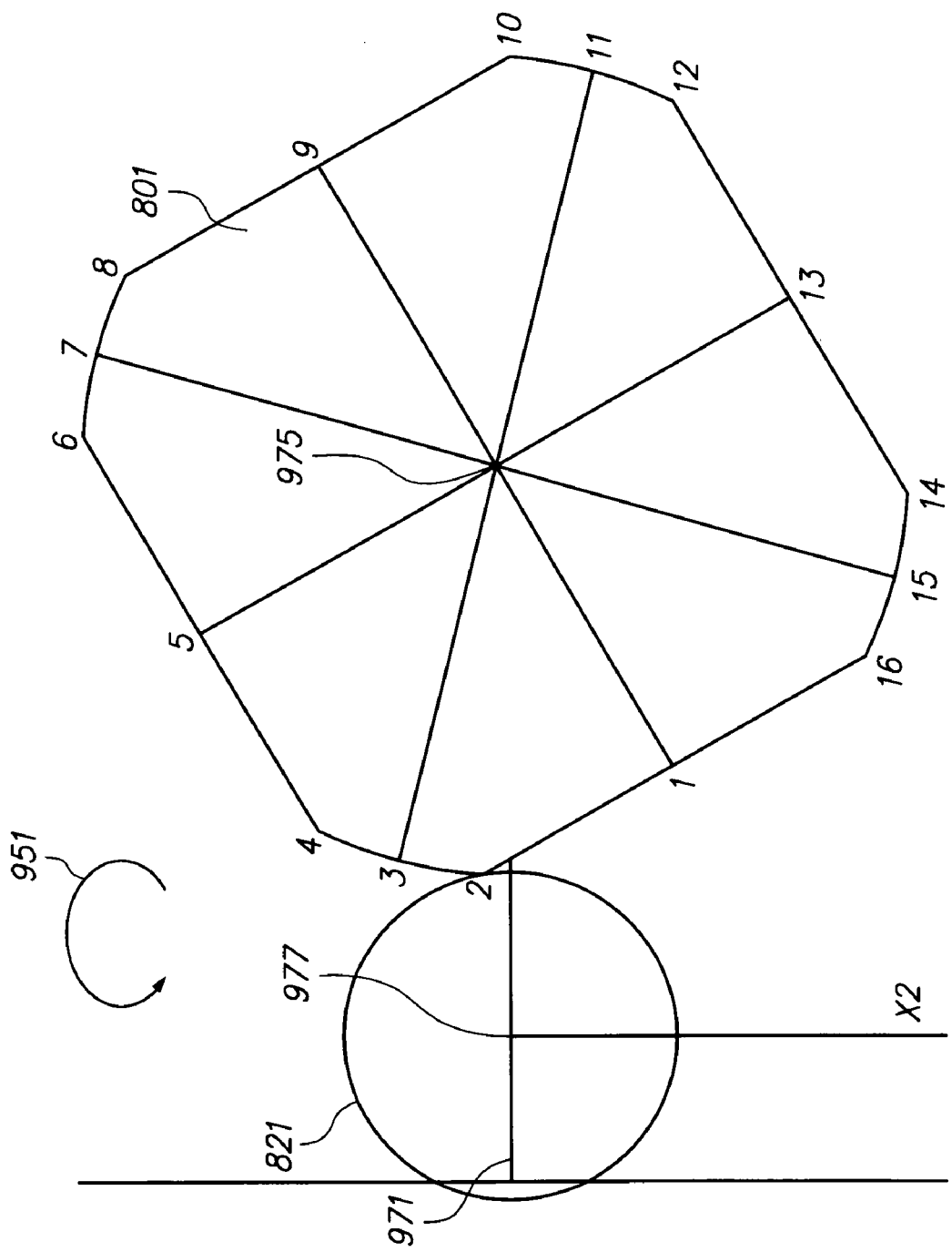

FIG. 13C shows the center of the roller 821 moved by the control system 900 to a location 977 (see also, position X2 on the horizontal axis) on the axis 971 to make room for the edge point 2 when the substrate 801 rotates. This allows coating material to be applied from the roller 821 to the edge point 2 of the substrate 801 without physical contact between the edge point 2 and the roller 821.

Figure 13D:
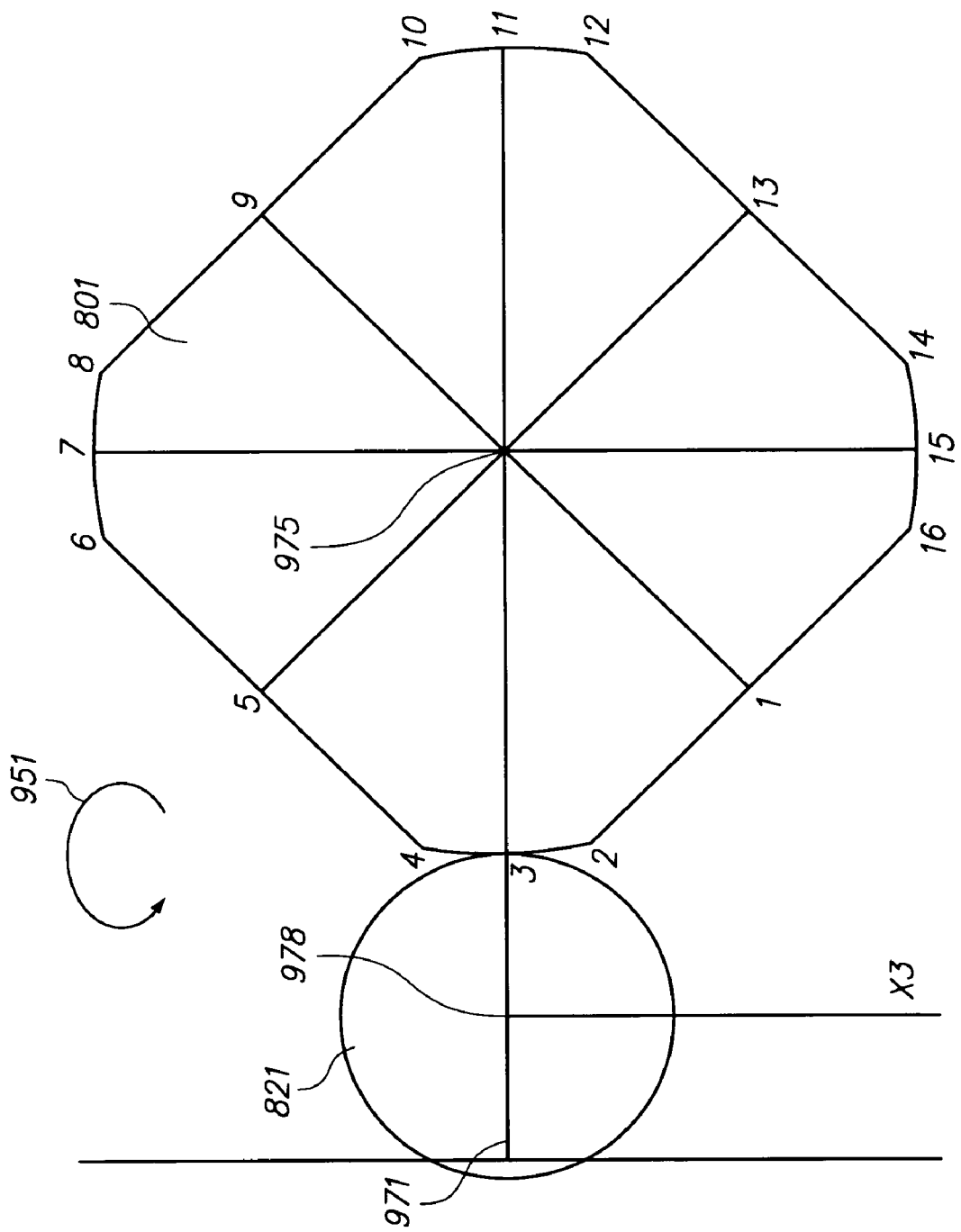

FIG. 13D shows the center of the roller 821 moved by the control system 900 to a location 978 (see also, position X3 on the horizontal axis) on the axis 971 when the substrate 801 rotates such that edge point 3 is on the axis 972.

The control system 900 continually adjusts the roller 821 towards and away from the substrate 801 to maintain a coating distance with the substrate 801 to perform non-contact edge coating.

Figure 14:
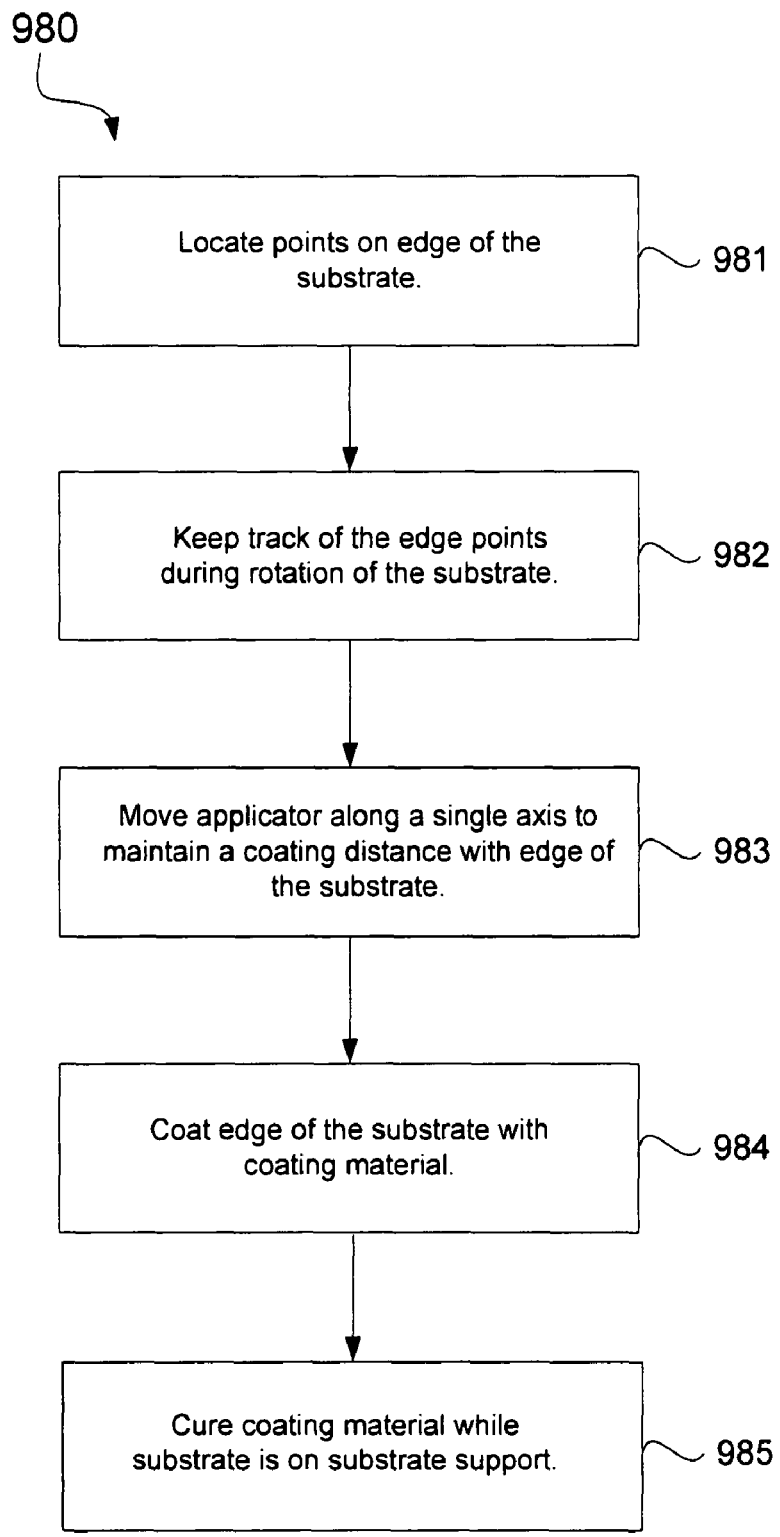
FIG. 14 shows a flow diagram of a method of coating an edge of a solar cell substrate in accordance with an embodiment of the present invention.

FIG. 14 shows a flow diagram of a method 980 of coating an edge of a solar cell substrate in accordance with an embodiment of the present invention. The method 980 is explained using the components of the non-contact edge coating system 800 for illustration purposes only. Other components may also be used without detracting from the merits of the present invention.

The method 980 begins by locating points on the edge of the substrate prior to starting the edge coating process (step 981). For example, the transport 810 (see FIG. 8) may pick up the substrate 801 from the pre-alignment station 863 and place the substrate 801 onto the chuck 843. The data acquisition and control software 944 (see FIG. 12) may command the data acquisition module 953 to take an image of the substrate 801. From the image, the software 944 may locate points on the edge of the substrate.

The edge points are then tracked during rotation of the substrate (step 982). For example, the software 944 may continually receive images of the substrate 801 as it is rotated while held by the chuck 843. The substrate 801 is rotated about a fixed rotation axis which coordinate is known to the software 944. By keeping track of the edge points, the software 944 can calculate the trajectory of the edge of the substrate 801, and thus how far the edge of the substrate 801 extends onto the single axis of motion of the roller 821. This allows the software 944 to determine a coating distance between the roller 821 and the edge of the substrate 801 while the roller 821 and the substrate 801 are rotated.

The applicator applying the coating material to the edge of the substrate is moved along a single axis to maintain a coating distance with the edge of the substrate (step 983). Continuing the example using the non-contact edge coating system 800, the software 944 sends control signals to the drive module 942 to drive the slider assembly 824 such that there is a coating distance between a surface of the groove 825 (see FIG. 11A) and the edge of the substrate 801 during rotation of the roller 821 and the substrate 801. The coating distance may be a predetermined constant distance or a range that allows for coating of the edge of the substrate 801.

The edge of the substrate is coated with the coating material while the substrate is rotated (step 984). For example, coating material may be applied on the groove 825 of the roller 821. The coating material on the groove 825 is then imparted on the edge of the substrate 801 as the roller 821 and the substrate 821 are rotated. The coating material may comprise thermal ink, hot melt ink, or, preferably, UV curable plating resist.

The coating material may be cured while the substrate is on the substrate support (step 985). This is an optional step applicable when using, for example, UV curable plating resist. In that case, the curing components 851 are activated to cure the UV curable plating resist coated on the edge of the substrate 801 while the substrate 801 is still on the chuck 843. This allows the coating and curing steps to be performed in one loading of the substrate 801 onto the chuck 843.

The transport 810 may pick up the substrate 801 from the chuck 843 and return it to the pre-alignment station 863 after the edge coating process.

Apparatus and methods for non-contact edge coating of solar cell substrates have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. An edge coating apparatus for a solar cell substrate, the apparatus comprising:
    a first transport comprising:
       a cam; and
       a single-substrate support adapted to receive a non-circular solar cell having a center point, top and bottom surfaces, and a perimeter edge, the single-substrate support further adapted to rotate the non-circular solar cell about the center point;
    a roller applicator comprising a roller member, the roller applicator adapted to rotate the roller member around a central roller axis and to dispense a coating material from the roller member; and
    an alignment assembly comprising:
       slider assembly; and
       a follower that is concentric with the roller member, the slider assembly engaged to push the follower to contact the cam, the follower supporting the roller member and adapted to move the roller member along a following axis in accordance with the interface between the follower and the cam, the following axis extending between the center of the non-circular solar cell and the central roller axis, the slider assembly further adapted to adjust the position of the roller member along the following axis to maintain a fixed distance between the roller member and the perimeter edge of the non-circular solar cell such that the roller member does not contact the perimeter edge of the non-circular solar cell.

2. The apparatus claim 1, wherein the coating material comprises hot melt ink.

3. The apparatus of claim 1, wherein the coating material comprises ultraviolet (UV) curable plating resist.

4. The apparatus of claim 3, further comprising a UV-light emitter adapted to direct UV light to the edge of the non-circular solar cell while the substrate is on the single-substrate support.

5. The apparatus of claim 1, wherein the single-substrate support comprises a chuck adapted to hold the non-circular solar cell by vacuum force.

6. The apparatus of claim 1, wherein the roller member comprises a roller having a groove adapted to receive the edge of the substrate to apply the coating material thereon.

7. The apparatus of claim 1, further comprising a second transport adapted to move the non-circular solar cell from a first station where the roller applicator applies the coating material to the edge of the non-circular solar cell and a second station.

8. The apparatus of claim 7, wherein the transport comprises a pick and place robot.

9. An edge coating apparatus for a solar cell substrate, the apparatus comprising:
a transport comprising:
a cam; and
a single-substrate support adapted to receive a non-circular solar cell with a center point and further adapted to rotate the non-circular solar cell about the center point;
a roller applicator comprising a roller member, the roller applicator adapted to rotate the roller member around a central roller axis and to dispense a coating material from a recessed portion in the roller member adapted to receive a top, bottom and side edge of the non-circular solar cell; and
an alignment assembly comprising:
a slider assembly; and
a follower that is concentric with the roller member, the slider assembly engaged to push the follower to contact the cam, the follower supporting the roller applicator and adapted to move the roller applicator along a following axis to allow for the application of the coating material to the top, bottom and side edge of the solar cell substrate, the recessed portion in the roller member maintaining a fixed distance between the roller member and the perimeter edge without the roller applicator contacting the edge of the solar cell substrate in accordance with the interface between the follower and the cam.

10. The apparatus of claim 9 wherein the coating material comprises hot melt ink.

11. The apparatus of claim 9 wherein the coating material comprises ultraviolet (UV) curable plating resist.

12. The apparatus of claim 9 further comprising a single-substrate support configured to hold the non-circular solar cell by vacuum force while the non-circular solar cell is rotated to have the coating material applied on the edge of the non-circular solar cell.

13. The apparatus of claim 9 further comprising a transport configured to transfer the non-circular solar cell between the first position where the edge of the non-circular solar cell is coated with the coating material and a second position configured to pre-align the non-circular solar cell for pick-up by the transport.

14. The apparatus of claim 9 wherein the transport comprises a multi-axis robot.

* * * * *